United States Patent
Kim et al.

(10) Patent No.: US 6,818,473 B2
(45) Date of Patent: Nov. 16, 2004

(54) METHOD FOR FABRICATING CERAMIC CHIP PACKAGES

(75) Inventors: Joon II Kim, Seoul (KR); Chul Ho Kim, Kyungki-do (KR); Ik Seo Choi, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 37 days.

(21) Appl. No.: 10/394,228

(22) Filed: Mar. 24, 2003

(65) Prior Publication Data

US 2003/0194835 A1 Oct. 16, 2003

(30) Foreign Application Priority Data

Apr. 10, 2002 (KR) ................................ 10-2002-0019385

(51) Int. Cl.[7] .................. H01L 21/44; H01L 21/48; H01L 21/50
(52) U.S. Cl. .................. 438/107; 438/106; 438/110; 438/113
(58) Field of Search .................. 438/25, 26, 33, 438/64, 67, 68, 106, 107, 110, 113, 127

(56) References Cited

U.S. PATENT DOCUMENTS 5,776,798 A * 7/1998 Quan et al. ............... 438/112
6,512,288 B1 * 1/2003 Shin et al. .................. 257/678

* cited by examiner

Primary Examiner—Richard Elms
Assistant Examiner—Beth E. Owens
(74) Attorney, Agent, or Firm—Lowe Hauptman Gilman & Berner LLP

(57) ABSTRACT

Described is a method for fabricating ceramic chip packages in which an epoxy resin containing fine ceramic particles is applied on a ceramic substrate provided with chip packages respectively having a plurality of chips mounted thereon, thereby improving reliability and endurance of the package and miniaturizing the size of the package. The epoxy resin is applied on the ceramic substrate provided with a plurality of the chips mounted thereon except a designated region, thereby minimizing the deformation of the substrate. The epoxy resin layer is formed on the substrate by two steps including a first step for forming a first epoxy resin layer serving as a dam and a second step for forming a second epoxy resin layer, thereby reducing the amount of the used epoxy resin and improving reliability and endurance of the package against temperature and humidity.

21 Claims, 6 Drawing Sheets

METHOD FOR FABRICATING CERAMIC
CHIP PACKAGES

BACKGROUND OF THE INVENTION

1. Field of the Invention

The present invention relates to a method for fabricating ceramic chip packages, and more particularly to a method for fabricating ceramic chip packages in which an epoxy resin containing fine ceramic particles is applied on a ceramic substrate provided with a plurality of chips mounted thereon, thereby protecting the chips mounted on the substrate from external stresses and improving reliability and endurance of the fabricated ceramic chip packages.

2. Description of the Related Art

Generally, semiconductor devices are packaged and the semiconductor device packages are mounted on a printed circuit board. The package is constructed so that terminals of the semiconductor device of the package are easily connected to signal patterns of the printed circuit board, and serves to protect the semiconductor device from external stresses so as be improved in reliability. Recently, the semiconductor device package is more and more miniaturized so as to meet miniaturization trends of electronic products. Therefore, in order to satisfy the trend toward miniaturization, a chip scale package has been developed.

Figure 1:
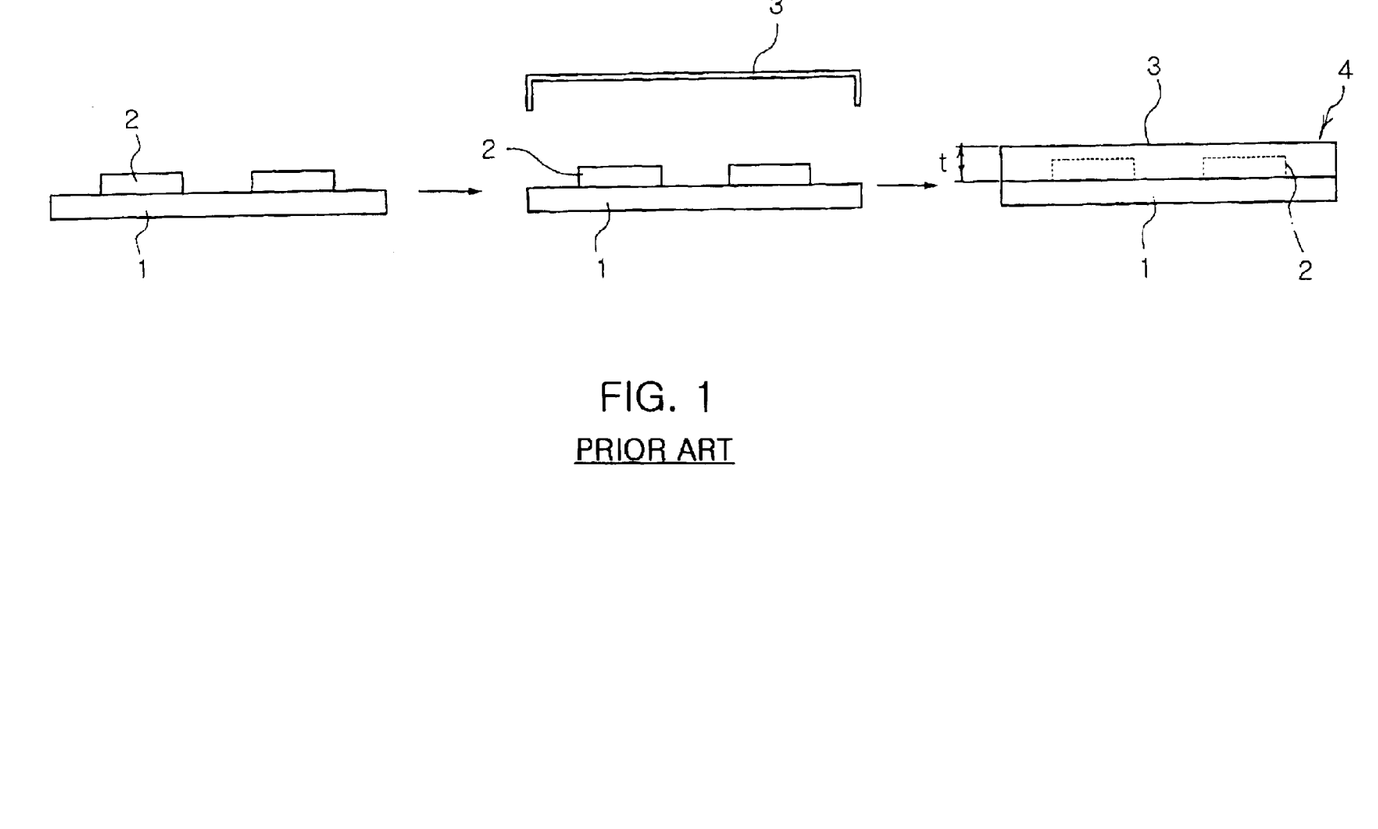
FIG. 1 is a cross-sectional view illustrating a process for fabricating a conventional ceramic chip package.

FIG. 1 is a schematic cross-sectional view illustrating a process for fabricating a conventional chip scale package. As shown in FIG. 1, a plurality of chips 2 are mounted on a ceramic substrate 1. The upper surface of the ceramic substrate 1 provided with the chips 2 mounted thereon is covered with a metal lid 3 so as to protect the chips 2 from external stresses, thereby being completed as a package 4. Herein, the metal lid 3 may serve as a ground in forming signal patterns of the substrate 1.

As shown in FIG. 1, in the conventional ceramic chip package 4, the metal lid 3 attached to the upper surface of the substrate 1 has a large height (t) of approximately 800 $\mu$m from the upper surface of the substrate 1. In case the height (t) of the metal lid 3 is decreased, the bottom surface of the metal lid 3 is attached to the upper surfaces of the chips 2, thereby generating a problem of insufficient insulation between the metal lid 3 and the chips 2. Therefore, in order to electrically insulate the metal lid 3 from the chips 2, an insulating material must be applied on the upper surfaces of the chips 2. In case the chips mounted on the substrate 1 are diodes, since the height of the diode from the upper surface of the substrate 1 is approximately 550 $\mu$m, in order to avoid the aforementioned insufficient insulation problem, the metal lid 3 must have a height t of approximately 800 $\mu$m.

However, electronic devices and systems recently show a tendency to become smaller, thinner, and lighter, i.e., miniaturized. Under this condition, the greater height of the metal lid 3 of the conventional ceramic chip package 4 is an obstruction of the miniaturization trend, thereby increasing the total thickness of an electronic part including the ceramic chip package 4. Further, it is only limitedly possible to reduce the thickness of the metal lid, thereby limiting the miniaturization of the ceramic chip package. Moreover, conventionally, since the metal lid is individually attached to each substrate of the plural packages in a step for manufacturing parts made of ceramic, the productivity of a finished product is deteriorated. Besides, the conventional metal lid attached to the upper surface of the substrate deteriorates the reliability and the endurance of the product against moisture and heat.

Therefore, there is required a chip package with a micro size and simple structure, which is easily fabricated and not limited to its total thickness.

SUMMARY OF THE INVENTION

Therefore, the present invention has been made in view of the above problems, and it is an object of the present invention to provide a method for fabricating ceramic chip packages in which an epoxy resin containing fine ceramic particles is applied on a ceramic substrate so as to protect plural chips mounted on the ceramic substrate from external stresses, thereby improving the reliability and the endurance of the package.

It is another object of the present invention to provide a method for fabricating ceramic chip packages, in which the total thickness of the package is reduced and the production process of the packages is simple.

In accordance with one aspect of the present invention, the above and other objects can be accomplished by the provision of a method for fabricating ceramic chip packages comprising the steps of: (i) preparing a ceramic substrate provided with a plurality of chips mounted thereon and grouped into a plurality of packages; (ii) forming an epoxy resin layer on the ceramic substrate except a designated region selected from an area without chips mounted thereon so as to cover the chips; (iii) hardening the epoxy resin layer; and (iv) dicing the ceramic substrate into a plurality of the packages.

Preferably, the epoxy resin layer may contain $SiO_2$, and have a uniform thickness and a flat upper surface. Further, preferably, the epoxy resin layer may be formed on the ceramic substrate by forming a first epoxy resin layer on the ceramic substrate at the same thickness as the height of each of the chips mounted on the ceramic substrate, and by forming a second epoxy resin layer so as to cover the chips and the first epoxy resin layer. The first epoxy layer serving as a dam may be formed using an epoxy resin with a viscosity higher than that of the second epoxy resin by approximately 10 poises. Moreover, preferably, the designated region without the epoxy resin layer may be formed on the center of the ceramic substrate.

In accordance with another aspect of the present invention, there is provided a method for fabricating ceramic chip packages comprising the steps of: (i) preparing a ceramic substrate provided with a plurality of chips mounted thereon and grouped into a plurality of packages; (ii) stacking on the ceramic substrate a dam member provided with openings corresponding to the packages of the ceramic substrate so that the packages of the ceramic substrate are exposed to the outside by the corresponding openings of the dam member; (iii) forming an epoxy resin layer on the exposed upper surface of the packages from the dam member so as to cover a plurality of the chips; (iv) hardening the epoxy resin layer; and (v) dicing the ceramic substrate into a plurality of the packages.

Preferably, in the step (v), the ceramic substrate may be diced into a plurality of the packages, each package including the dam member attached to its edge. Alternatively, in the step (v), the ceramic substrate may be diced into a plurality of the packages, each package not including the dam member attached to its edge. Further, preferably, the ceramic substrate may be attached to the dam member by the epoxy resin layer. A total thickness of the chip package may be controlled by adjusting a thickness of the dam member.

Moreover, the dam member may be formed by stacking a plurality of ceramic sheets formed by a punching method, and protrusions and/or depressions may be formed on the inner side walls of the openings of the dam member. The dam member may be made of a ceramic material, a molded organic material (plastics), or a metal material (aluminum, stainless steel, etc).

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 2A:
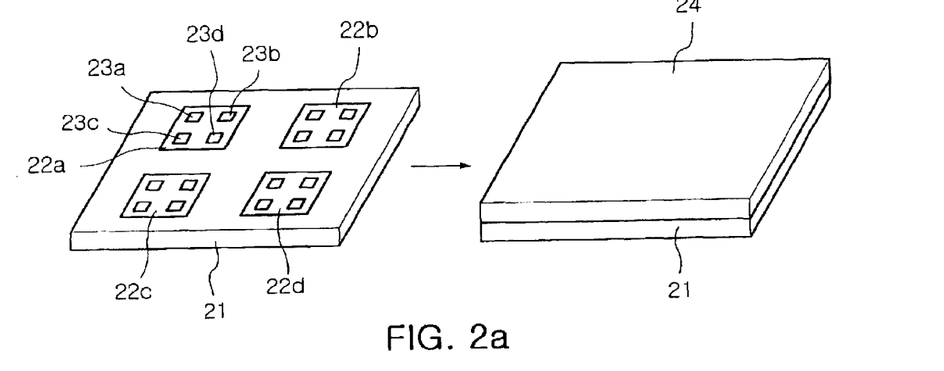
FIGS. 2a to 2c are perspective and cross-sectional views illustrating a process for fabricating ceramic chip packages in accordance with an embodiment of the present invention.
Figure 2B:
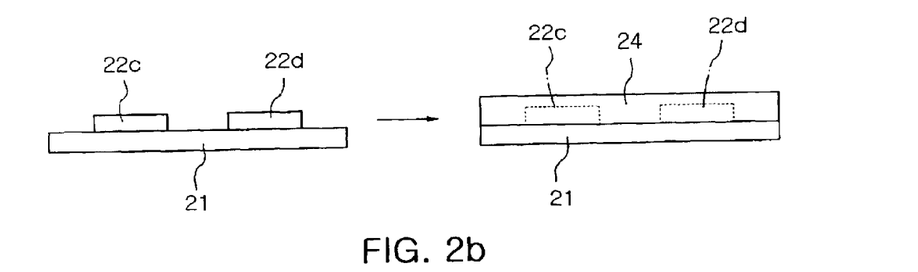
Figure 2C:
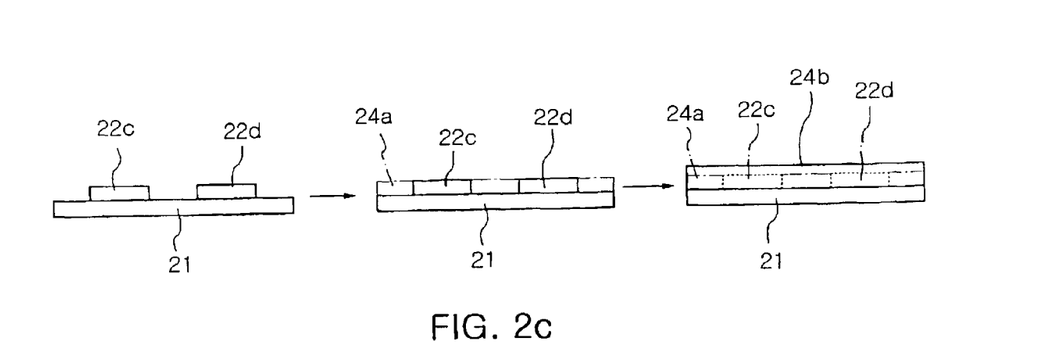

FIGS. 2a, 2b, and 2c are perspective and cross-sectional views illustrating a process for fabricating ceramic chip packages in accordance with an embodiment of the present invention.

With reference to FIG. 2a, a bar-shaped ceramic substrate 21 is prepared and a plurality of chips 23a, 23b, 23c, and 23d are mounted on the ceramic substrate 21. Although four chips are shown in the FIG. 2a, the present invention is not limited to the number of the chips mounted on the ceramic substrate 21. The aforementioned plural chips 23a, 23b, 23c, and 23d are packaged as a single chip package 22a. Although four chip packages 22a, 22b, 22c, and 22d are shown in FIG. 2a, the present invention is not limited to the number of the chip packages mounted on the ceramic substrate 21. Therefore, as shown in FIG. 2a, the bar-shaped ceramic substrate 21 comprising plural chips 23 packaged as plural packages 22 is prepared. Then, an epoxy resin layer 24 is formed on the ceramic substrate 21 so as to at least cover plural chips 23. Preferably, the epoxy resin layer 24 contains fine $SiO_2$ particles. Since the thermal expansion coefficient of $SiO_2$ is low, an epoxy resin applied on the ceramic substrate 21 minimizes the deformation of the ceramic substrate 21. Further, the fine $SiO_2$ particles fill gaps between the chips 23 and the ceramic substrate 21 as well as gaps between the chips 23. The epoxy resin layer 24 is formed on the ceramic substrate 21 so that the thickness of the epoxy resin layer 24 is uniform over it entire area and the upper surface of the epoxy resin layer 24 is planar. Herein, the thickness of the epoxy resin layer 24 is preferably 200~350 $\mu$m.

Although not shown in the drawings, the epoxy resin layer 24 is hardened, and then the ceramic substrate 21 is diced into a plurality of the chip packages 22. The epoxy resin layer 24 is hardened by heat generated from a heater installed above and below the substrate 21 and provided with a plurality of heat sources.

Herein, the epoxy resin layer 24 is formed on the substrate 21 by two different methods. The two methods are respectively shown in FIGS. 2b and 2c. FIGS. 2b and 2c are cross-sectional views of FIG. 2a in accordance with the two methods for forming the epoxy resin layer 24.

With reference to FIG. 2b, the epoxy resin layer 24 is formed on the substrate 21 by one step so as to cover the chip packages 22c and 22d mounted on the bar-shaped ceramic substrate 21. Then, the epoxy resin layer 24 formed by applying the epoxy resin on the ceramic substrate 21 is hardened and the ceramic substrate 21 is diced into a plurality of the chip packages 22c and 22d. In case the epoxy resin layer 24 is formed on the whole upper surface of the ceramic substrate 21 as shown in FIG. 2b, a large amount of the used epoxy resin is required.

With reference to FIG. 2c, the epoxy resin layer 24 is formed on the substrate 21 by two steps so as to cover the chip packages 22c and 22d mounted on the bar-shaped ceramic substrate 21. As shown in FIG. 2c, the chip packages 22c and 22d are mounted on the bar-shaped ceramic substrate 21. Then, the epoxy resin is applied on the ceramic substrate 21 so as to have the same thickness as the height of the chip packages 22c and 22d, thereby forming a first epoxy resin layer 24a serving as a dam. The first epoxy resin layer 24a is hardened by heat. Next, an epoxy resin with a viscosity lower than that of the first epoxy resin layer 24a is applied on the upper surfaces of the first epoxy resin layer 24a and the chip packages 22c, and 22d so as to cover the chip packages 22c and 22d and the first epoxy resin layer 24a, thereby forming a second epoxy resin layer 24b. Preferably, the epoxy resin forming the first epoxy resin layer 24a has a viscosity higher than that of the epoxy resin forming the second epoxy resin layer 24b by approximately 10 Poises. Herein, the total thickness of the ceramic chip package can be controlled by adjusting the thickness of the first epoxy resin layer 24a formed on the ceramic substrate 21. Then, the second epoxy resin layer 24b is hardened by heat and the ceramic substrate 21 is diced into a plurality of unit chip packages 22c and 22d.

The ceramic substrate 21 of the ceramic chip package completed by the aforementioned method is sensitive to the amount of the used epoxy resin and the hardening temperature of the epoxy resin. Therefore, after the epoxy resin layer 24 is hardened, the ceramic substrate 21 is deformed. Therefore, in order to minimize the deformation of the ceramic substrate 21, another embodiment of the present invention is shown in FIGS. 3a to 3c.

Figure 3A:
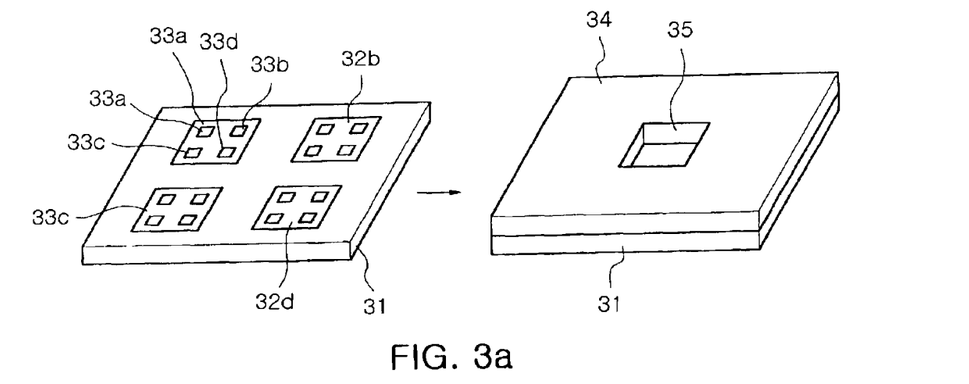
FIGS. 3a to 3c are perspective and cross-sectional views illustrating a process for fabricating ceramic chip packages in accordance with another embodiment of the present invention.
Figure 3B:
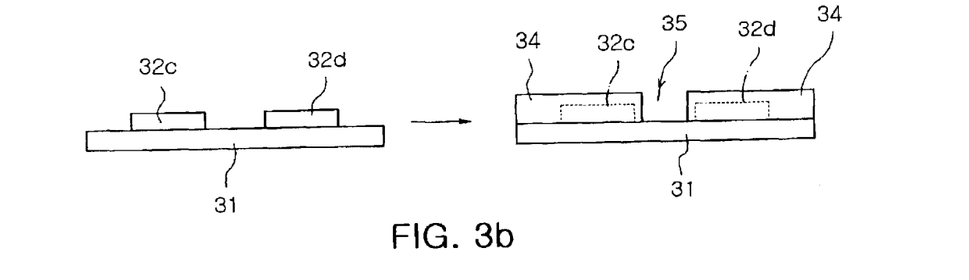
Figure 3C:
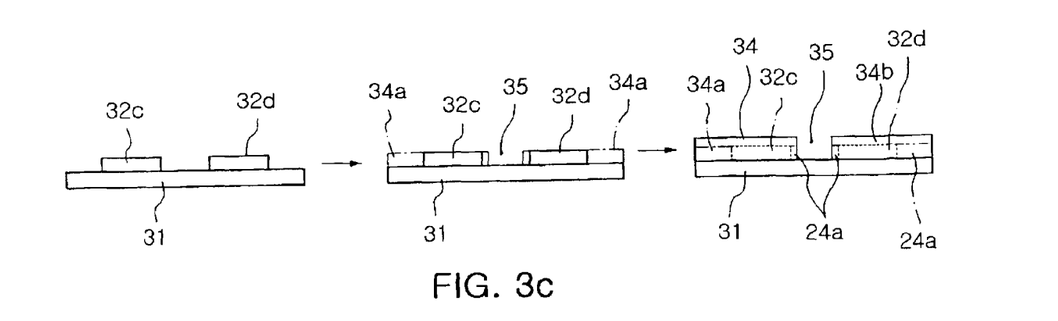

FIGS. 3a to 3c are perspective and cross-sectional views illustrating a process for fabricating ceramic chip packages in accordance with another embodiment of the present invention. Hereinafter, the same similar elements are denoted by the same reference numerals even through they are depicted in different drawings. First, with reference to FIG. 3a, the process for fabricating the ceramic chip packages is described in detail.

With reference to FIG. 3a, similarly to the FIG. 2a, the bar-shaped ceramic substrate 31 is prepared, and a plurality of the chips 33a, 33b, 33c, and 33d packaged as a plurality of the chip packages 32a, 32b, 32c, and 32d are mounted on the ceramic substrate 31. As described above, the present invention is not limited to the number of the chips and the chip packages mounted on the ceramic substrate 31. Then, the epoxy resin layer 34 is formed on the ceramic substrate 31 by applying the epoxy resin on the ceramic substrate 31 except a designated region 35 selected from an area without the chip mounted thereon. That is, the epoxy resin layer 34 is formed on the ceramic substrate 31 except the region 35 without the chip mounted thereon. The selective formation of the epoxy resin layer 34 on the ceramic substrate 31 minimizes the warpage of the ceramic substrate 31 generated in case the epoxy resin layer 34 is formed on the whole surface of the substrate 31 and then hardened. That is, the region 35 without the epoxy resin layer 34 formed thereon minimizes the warpage of the ceramic substrate 31 generated in case the epoxy resin layer 34 is formed on the whole upper surface of the ceramic substrate 31. Preferably, the region 35 without the epoxy resin layer formed thereon is formed on the center of the ceramic substrate 31. The central region 35 without the epoxy resin layer formed thereon serves to maintain an equilibrium state of forces acting on the substrate 31, thereby minimizing the deformation of the substrate 31 such as the warpage of the substrate 31. However, the region 35 without the epoxy resin layer 34 formed thereon is not limited in its position and its number on the ceramic substrate 31.

Similarly to the process as shown in FIG. 2, the epoxy resin layer 34 of this embodiment of the present invention is formed on the substrate 31 by two different methods. The two methods are respectively shown in FIGS. 3b and 3c. FIGS. 3b and 3c are cross-sectional views of FIG. 3a in accordance with the two methods for forming the epoxy resin layer 34. Herein, the same elements are denoted by the same reference numerals even through they are depicted in different drawings.

With reference to FIG. 3b, the epoxy resin layer 34 is formed on the substrate 31 by one step so as to cover the chip packages 32c and 32d mounted on the bar-shaped ceramic substrate 31. However, as described above, the epoxy resin layer 34 is formed on the substrate 31 except the region 35. Then, the epoxy resin layer 34 formed by applying the epoxy resin on the ceramic substrate 31 is hardened by heat from the heater or so on, and the ceramic substrate 31 is diced into a plurality of the chip packages 32c and 32d.

With reference to FIG. 3c, the epoxy resin layer 34 is formed on the substrate 31 except the region 35 by two steps so as to cover the chip packages 32c and 32d mounted on the bar-shaped ceramic substrate 31. As shown in FIG. 3c, as described above, the chip packages 32c and 32d are mounted on the bar-shaped ceramic substrate 31, and the epoxy resin is applied on the ceramic substrate 31 so as to have the same thickness as the height of each of the chip packages 32c and 32d, thereby forming a first epoxy resin layer 34a serving as an epoxy dam. Herein, the first epoxy resin layer is not formed on the central region 35 of the ceramic substrate 31. Preferably, the applied epoxy resin contains $SiO_2$ particles. As described above, since the thermal expansion coefficient of $SiO_2$ is low, the epoxy resin applied on the ceramic substrate 31 minimizes the deformation of the ceramic substrate 31. Further, the $SiO_2$ particles fill gaps between the chips 33 and the ceramic substrate 21 as well as gaps between the chips 33. Then, the first epoxy resin layer 34a is hardened by heat. Next, an epoxy resin with a viscosity lower than that of the first epoxy resin layer 34a is applied on the upper surfaces of the first epoxy resin layer 34a and the chip packages 32c and 22d so as to cover the chip packages 32c and 32d and the first epoxy resin layer 34a, thereby forming the second epoxy resin layer 34b. Herein, the second epoxy resin layer 34b is not formed on the central region 35 of the substrate 31. Herein, the total thickness of the ceramic chip package can be controlled by adjusting the thickness of the first epoxy resin layer 34a formed on the ceramic substrate 31. Then, the second epoxy resin layer 34b is hardened by heat, and the ceramic substrate 31 is diced into a plurality of unit chip packages 32c and 32d.

However, in case the dam made of epoxy is formed on the substrate, it is very difficult to finely adjust the thickness of the epoxy dam. Further, the ceramic substrate 31 is sensitive to the amount and the hardening temperature of the used epoxy resin. Therefore, it is preferable to reduce the amount of the epoxy resin applied on the ceramic substrate as much as possible. FIG. 4 shows a process for reducing the amount of the used epoxy.

FIGS. 4a to 4e are perspective views illustrating a process for fabricating ceramic chip packages using a ceramic dam in accordance with yet another embodiment of the present invention. The dam of the ceramic chip packages of FIGS. 2 and 3 is made of epoxy resin, but the dam of the ceramic chip packages of FIG. 4 is made of a bar-shaped ceramic member. Hereinafter, with reference to FIGS. 4a to 4e, the process for fabricating ceramic chip packages using the ceramic dam will be described in detail.

Figure 4A:
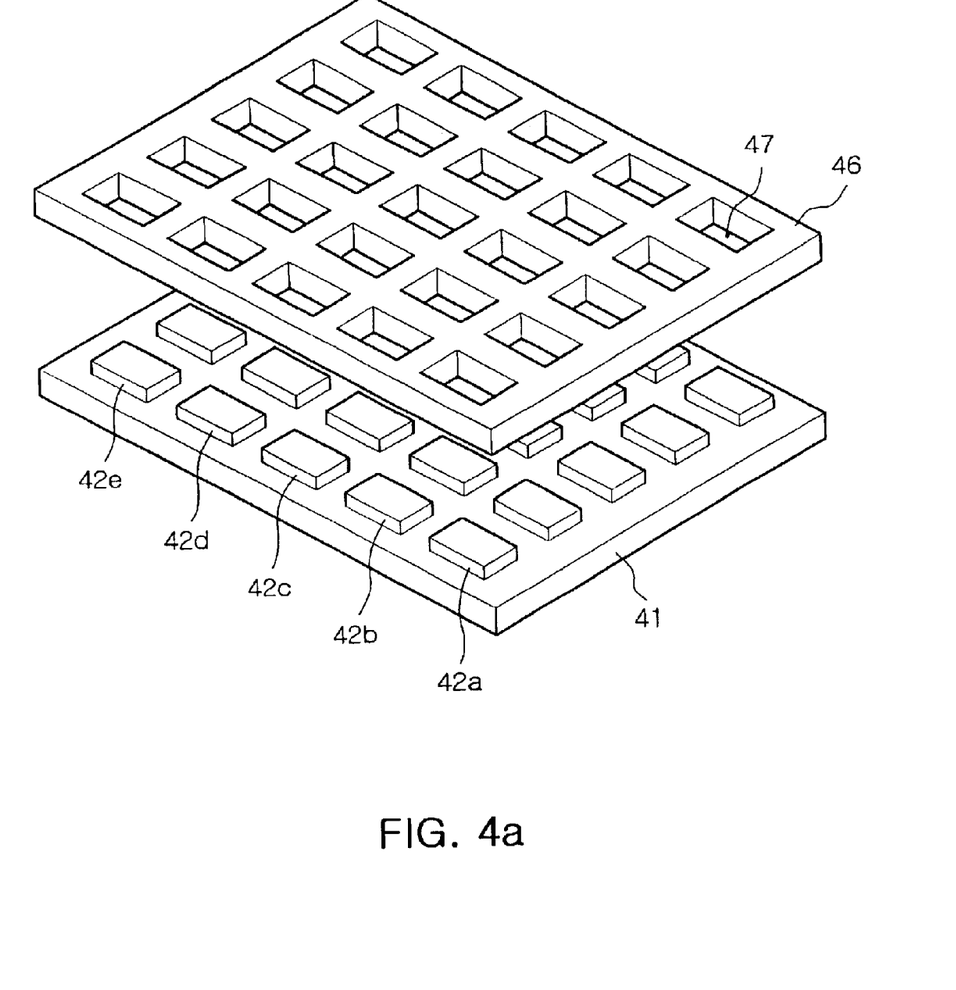
FIGS. 4a to 4e are perspective views illustrating a process for fabricating ceramic chip packages using a ceramic dam in accordance with yet another embodiment of the present invention.

Similarly to FIG. 2a, FIG. 4a shows the bar-shaped ceramic substrate 41 provided with a plurality of chips packages 42a, 42b, 42c, and 42d mounted thereon. Further, a bar-shaped dam member 46 provided with a plurality of openings 47 formed by perforating designated areas of the dam member 46 corresponding to the chip packages 42a, 42b, 42c, and 42d of the ceramic substrate 41 is prepared. FIGS. 4a to 4e illustrate a process for attaching the dam member 46 to the ceramic substrate 41. Although twenty-five (25) chip packages are mounted on the ceramic substrate 41 in the drawings, the present invention is not limited to the number of the chip packages mounted on the ceramic substrate. As shown in FIG. 4a, the bar-shaped dam member 46 comprises a plurality of the openings 47 corresponding to a plurality of the chip packages (twenty-five chip packages in the drawings) mounted on the ceramic substrate 41. Therefore, when the dam member 26 is attached to the ceramic substrate 41, a plurality of the openings 27 of the dam member 46 are respectively aligned on the respective one of the corresponding chip packages mounted on the ceramic substrate 41. Herein, preferably, the dam member 46 is attached to the ceramic substrate 41 by an epoxy resin. After the epoxy resin is applied on the ceramic substrate 41 and the dam member 46 is stacked on the ceramic substrate 41, the epoxy resin interposed between the ceramic substrate 41 and the dam member 46 is hardened. Therefore, the dam member 46 is attached to the ceramic substrate 41. The epoxy resin contains fine $SiO_2$ particles, and fills gaps between the dam member 46 and the chip packages 42a, 42b, 42c, and 42d as well as gaps between the substrate 41 and the dam member 46. Those skilled in the art will appreciate that the dam member 46 is manufactured by various methods. The ceramic dam member 46 may be manufactured by stacking a plurality of ceramic sheets formed by a punching method and attaching the ceramic sheets to each other. Herein, the ceramic sheets may be attached to each other using specific adhesive agents. Preferably, the epoxy resin is applied on the ceramic sheets and hardened so as to attach the ceramic sheets to each other. Further, the dam member may be made of ceramic materials, molded organic materials (for example, plastics), or metal materials (for example, aluminum, stainless steel, etc).

Figure 4B:
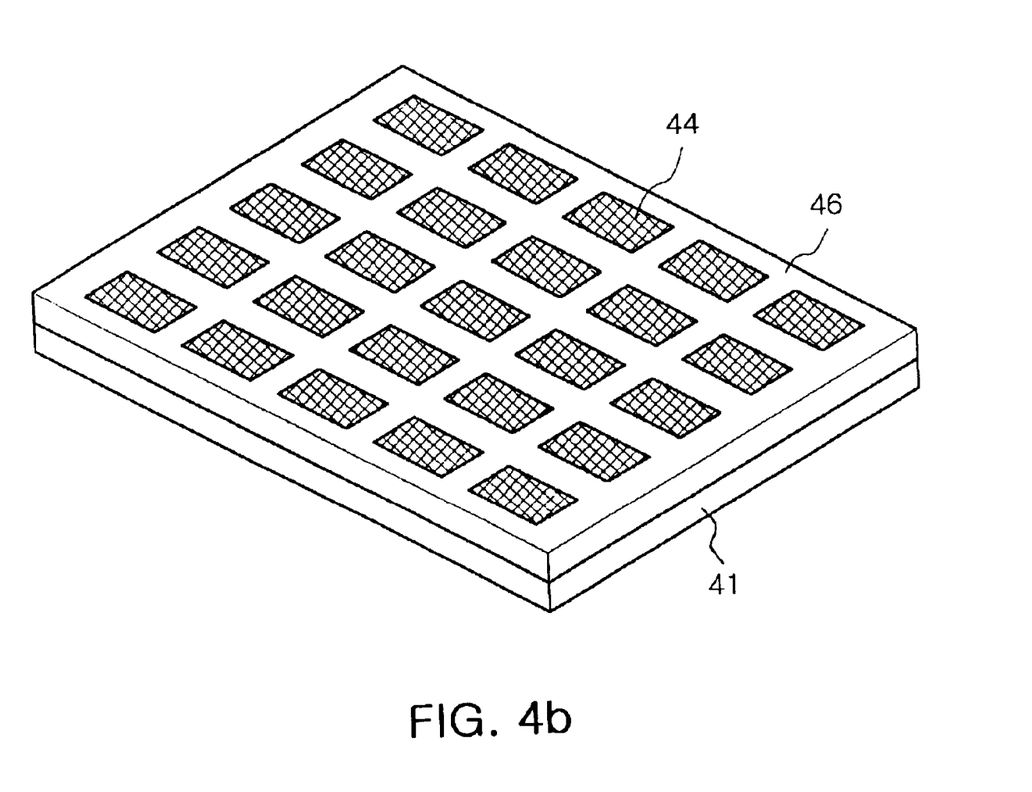
Figure 4C:
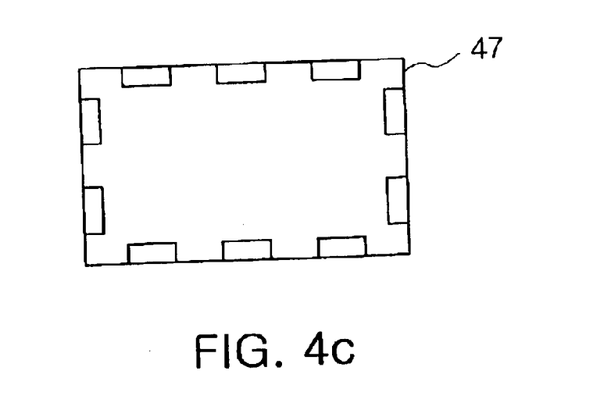
Figure 4D:
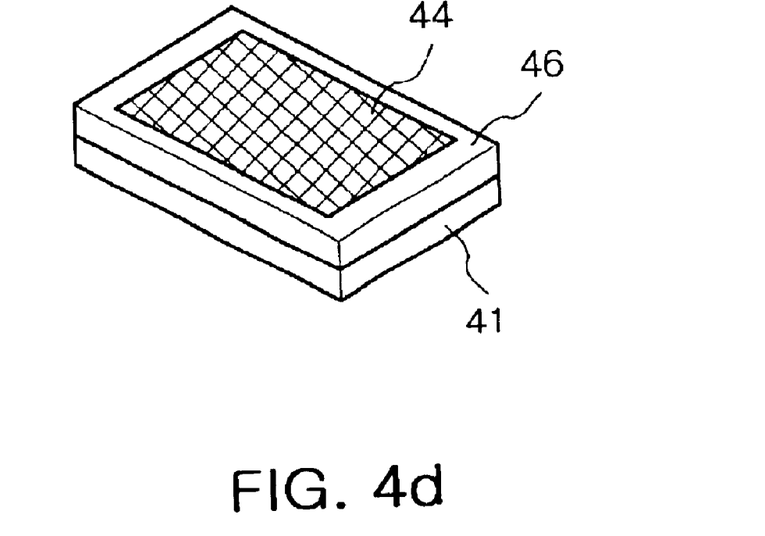
Figure 4E:
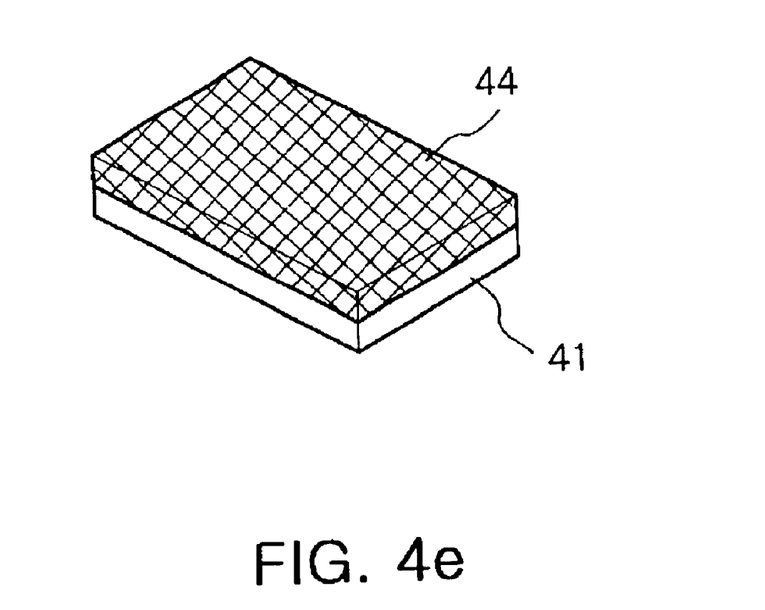

After the bar-shaped dam 46 is attached to the bar-shaped ceramic substrate 41 by the epoxy rein, as shown in FIG. 4b, an epoxy resin layer 44 is formed on the exposed upper surfaces of the chip packages through the openings 47 of the dam member 46. Then, the ceramic substrate 41 is diced into a plurality of the chip packages. Herein, FIG. 4d shows a diced chip package with the dam member 46 remaining around the edge of the package and FIG. 4e shows a diced chip package without the dam member 46. As shown in FIGS. 4d and 4e, the ceramic substrate 41 may be diced by various manners in accordance with the usage of the diced chip packages.

The total thickness of the chip package may be controlled by adjusting the thickness of the dam member 46. Further, the thickness of the epoxy resin layer 44 is minimized by using the dam member 46. Compared to the configurations of FIGS. 2 and 3, the configuration of FIG. 4 requires a reduced amount of the used epoxy resin and minimizes the deformation of the ceramic substrate 41 generated in hardening the epoxy resin layer.

It will be noted that protrusions and/or depressions are formed on the inner side walls of the openings 47 of the dam member 46. FIG. 4c shows a plan view of the opening 47 of the dam member 46. As shown in FIG. 4c, the protrusions are formed on four inner side walls of the opening 47 of the dam member 46. However, the protrusions and/or depressions may be formed on two opposite inner side walls of the opening 47 of the dam member 46. The protrusions and/or depressions formed on the inner side walls of the opening 47 serve to relieve a tension generated on the epoxy resin layer 44 after the epoxy resin layer 44 formed on the exposed upper surfaces of the chip package through the opening 47 of the dam member 46 is hardened. Therefore, the deformation of the ceramic chip package is minimized by the protrusions and/or depressions of the opening 47.

Further, the epoxy resin is applied on the bar-shaped substrate 41 provided with a plurality of the chip packages collectively mounted thereon, thereby being easy to fabricate and reducing the fabrication time of the chip packages.

As apparent from the above description, the present invention provides a method for fabricating ceramic chip packages, in which an epoxy resin layer is formed on a ceramic substrate, thereby reducing the total thickness of a ceramic chip module and manufacturing micro-sized ceramic chip packages.

The epoxy resin layer is selectively formed on the ceramic substrate, thereby minimizing the deformation of the ceramic substrate and fabricating ceramic chip packages with excellent reliability and endurance against heat and humidity.

Moreover, the epoxy resin layer is applied on the ceramic substrate provided with a plurality of chip packages mounted thereon, thereby shortening the fabrication time and improving the productivity. A metal material is not used in the method for fabricating the ceramic chip packages of the present invention, thereby reducing the production cost.

The present invention provides a chip package having a micro-sized structure comprising a plurality of chips or parts mounted on the substrate. Although the preferred embodiments of the present invention have been disclosed for illustrative purposes, those skilled in the art will appreciate that various modifications, additions and substitutions are possible, without departing from the scope and spirit of the invention as disclosed in the accompanying claims. That is, although chip packages are formed by dicing a single substrate provided with a plurality of chips mounted thereon in the preferred embodiments of the present invention, those skilled in the art will appreciate that chip packages may be formed by collectively preparing and dicing a set of plural substrates.

What is claimed is:

1. A method for fabricating ceramic chip packages comprising the steps of:
    (i) preparing a ceramic substrate provided with a plurality of chips mounted thereon;
    (ii) forming an epoxy resin layer on the ceramic substrate except a designated region selected from an area without chips mounted thereon so as to cover the chips;
    (iii) hardening the epoxy resin layer; and
    (iv) dicing the ceramic substrate into a plurality of the packages.

2. The method for fabricating ceramic chip packages as set forth in claim 1, wherein the epoxy resin layer contains $SiO_2$.

3. The method for fabricating ceramic chip packages as set forth in claim 1, wherein the epoxy resin layer has a uniform thickness and a flat upper surface.

4. The method for fabricating ceramic chip packages as set forth in claim 1, wherein the step (ii) comprises the sub-steps of:
    forming a first epoxy resin layer on the ceramic substrate at the same thickness as the height of each of the chips mounted on the ceramic substrate; and forming a second epoxy resin layer so as to cover the chips and the first epoxy resin layer.

5. The method for fabricating ceramic chip packages as set forth in claim 4, wherein the second epoxy resin layer is formed using an epoxy resin with a viscosity lower than that of the first epoxy resin.

6. The method for fabricating ceramic chip packages as set forth in claim 4, wherein the first epoxy layer serves as a dam.

7. The method for fabricating ceramic chip packages as set forth in claim 1, wherein the epoxy resin layer has a thickness of 200 to 350 μm.

8. The method for fabricating ceramic chip packages as set forth in claim 1, wherein the designated region without the epoxy resin layer is formed on the center of the ceramic substrate.

9. A method for fabricating ceramic chip packages comprising the steps of:
   (i) preparing a ceramic substrate provided with a plurality of chips mounted thereon;
   (ii) stacking on the ceramic substrate a dam member provided with openings corresponding to the packages of the ceramic substrate so that the packages of the ceramic substrate are exposed to the outside by the corresponding openings of the dam member;
   (iii) forming an epoxy resin layer on the exposed upper surface of the packages from the dam member so as to cover a plurality of the chips;
   (iv) hardening the epoxy resin layer; and
   (v) dicing the ceramic substrate into a plurality of the packages.

10. The method for fabricating ceramic chip packages as set forth in claim 9, wherein the epoxy resin layer contains $SiO_2$.

11. The method for fabricating ceramic chip packages as set forth in claim 9, wherein the epoxy resin layer has a uniform thickness and a flat upper surface.

12. The method for fabricating ceramic chip packages as set forth in claim 9, wherein the step (v) is characterized that the ceramic substrate is diced into a plurality of the packages, each package including the dam member attached to its edge.

13. The method for fabricating ceramic chip packages as set forth in claim 9, wherein the step (v) is characterized in that the ceramic substrate is diced into a plurality of the packages, each package not including the dam member attached to its edge.

14. The method for fabricating ceramic chip packages as set forth in claim 9, wherein the ceramic substrate is attached to the dam member by the epoxy resin layer.

15. The method for fabricating ceramic chip packages as set forth in claim 9, wherein a total thickness of the chip package is controlled by adjusting a thickness of the dam member.

16. The method for fabricating ceramic chip packages as set forth in claim 9, wherein protrusions and/or depressions are formed on the inner side walls of the openings of the dam member.

17. The method for fabricating ceramic chip packages as set forth in claim 9, wherein the dam member is formed by stacking a plurality of ceramic sheets formed by a punching method.

18. The method for fabricating ceramic chip packages as set forth in claim 17, wherein the ceramic sheets are attached to each other using the epoxy resin.

19. The method for fabricating ceramic chip packages as set forth in claim 9, wherein the dam member is made of a ceramic material.

20. The method for fabricating ceramic chip packages as set forth in claim 9, wherein the dam is made of a molded organic substance.

21. The method for fabricating ceramic chip packages as set forth in claim 9, wherein the dam is made of a metal material.

* * * * *